US006456114B1

United States Patent
Inoshita et al.

(12)

(10) Patent No.: US 6,456,114 B1
(45) Date of Patent: Sep. 24, 2002

(54) POWER CONSERVING CMOS SEMICONDUCTOR INTEGRATED CIRCUIT

(75) Inventors: Chizuru Inoshita; Kazuo Aoki; Toshinori Inoshita, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/861,647

(22) Filed: May 22, 2001

(30) Foreign Application Priority Data

Dec. 25, 2000 (JP) ........................................ 2000-393580

(51) Int. Cl.$^7$ ......................................... H03K 19/003
(52) U.S. Cl. ............................ 326/93; 326/95; 326/98
(58) Field of Search ............................. 326/93, 95, 98, 326/104, 105, 106, 108

(56) References Cited

U.S. PATENT DOCUMENTS 5,923,188 A * 7/1999 Kametani et al. ............. 326/93

5,999,086 A * 12/1999 Ecker ...................... 340/146.2

FOREIGN PATENT DOCUMENTS

JP          A1 9-312425       12/1997

* cited by examiner

*Primary Examiner*—Michael Tokar
*Assistant Examiner*—Vibol Tan
(74) *Attorney, Agent, or Firm*—Leydig, Voit & Mayer, Ltd.

(57) ABSTRACT

A semiconductor integrated circuit device includes a control circuit for coping with time differences in signals propagating along by differences in routes of the circuit device. In a definite data interval when changes of all signals have been completed, the control circuit outputs a received signal. In an indefinite data interval when changes of all signals have not been completed, the control circuit outputs a fixed signal irrespective of signal level of a received signal. The control circuit thus prevents irregular signal changes caused by the time differences before definition of data to subsequent circuits.

9 Claims, 15 Drawing Sheets

$Td1(max) - Td1(min) \geq Td$

Td2(max)−Td2(min)<Td

POWER CONSERVING CMOS SEMICONDUCTOR INTEGRATED CIRCUIT

FIELD OF THE INVENTION

The present invention relates to a semiconductor integrated device having a complementary metal oxide semiconductor (CMOS) structure. More particularly, this invention relates to a semiconductor integrated device capable of reducing power dissipation, and a method of designing such a semiconductor integrated device.

BACKGROUND OF THE INVENTION

Due to advance of frontier techniques, fabrication of fast, highly integrated, large scale integrated circuits ("ICs") has become possible in recent years. Therefore, construction of a fast, large capacity system has become possible. In such a system, however, an increase in power dissipation poses a problem. It has become very important to reduce the power dissipation of ICs used in devices in the system. By the way, the power dissipation of each IC is determined by charge and discharge currents of transistors that flow in order to activate the IC, through currents of transistors flowing at the time of IC operation, leakage currents of transistors flowing at the time of standstill of the IC, and so on.

As a conventional semiconductor integrated device in which a major part of power dissipation is occupied by the above described charge and discharge currents, a semiconductor integrated device having, for example, a CMOS structure (hereafter referred to as CMOS circuit) will now be described.

FIG. 17 is a diagram showing the current path of the conventional CMOS circuit. Reference number 101 denotes a PMOS transistor, and reference number 102 denotes a NMOS transistor. Moreover, reference number 104 denotes a power supply, and reference number 105 denotes ground connection ("GND"). Thus, an inverter circuit is formed. Reference number 103 denotes a load capacitor caused by wiring connected to an output of the inverter circuit and a circuit of a subsequent stage.

Following currents flow through this inverter circuit. That is, a through current 111, a charge current 112, and a discharge current 113. In switchover of "ON" and "OFF" of the PMOS transistor 101 and the NMOS transistor 102, the through current 111 flows from the power supply 104 to the GND 20 through the PMOS transistor 101 and the NMOS transistor 102, when both the PMOS transistor 101 and the NMOS transistor 102 temporarily turn "ON." When the PMOS transistor 101 is "ON," the charge current 112 flows from the power supply 104 into the load capacitance 103 through the PMOS transistor 101. When the NMOS transistor 102 is "ON," the discharge current 113 flows from the load capacitor 103 into the GND 105 through the NMOS transistor 102.

By the way, power dissipation P caused by the charge current 112 and the discharge current 113 can be represented by equation (1)

$$P = (1/2) \, CV^2 \qquad (1)$$

FIG. 18 is a diagram showing an example of a conventional semiconductor integrated device. FIG. 19 is a time chart showing operation of the conventional semiconductor integrated device. In FIG. 18, reference numeral 100 denotes an IC chip made of a CMOS element. Reference numerals 2, 3, 4, 10 and 11 denote independent internal block circuits in the IC chip 100. Reference numeral 5 denotes an inverter circuit functioning as a driver of a clock signal clk. Reference numeral 6 denotes a plurality of flip-flop circuits. Reference numeral 7 denotes an internal block circuit included in the internal block circuit 4. Reference numerals 8 and 13 denote composite gate circuits. Reference numerals 9 and 12 denote driver circuits. Reference symbols a, b, c, d, e, clk, 5o, 6a, 6b, 6c, 6d, 6e, 7a, 7b, 7c, 7d, 7e, 8o and 9o denote signals.

First of all, in the IC chip 100, for example, signals such as an output signal a of the internal block circuit 2, an input signal b input from the outside, a signal c generated within the internal block circuit 4, a signal d generated outside the internal block circuit 4, an output signal e of the internal block circuit 3 are individually output to the flip-flop circuits 6. The flip-flop circuits 6 latch the received signal at a falling edge of a clock signal 5o received via the inverter circuit 5.

The internal block circuit 7 receives the signals 6a to 6e output from the flip-flop circuits 6, generates and outputs signals 7a to 7e.

Upon receiving output signals 7a to 7e of the internal block circuit 7, the composite gate circuit 8 outputs a signal 8o assembled therein. The driver circuit 9 outputs a signal 9o having predetermined drive capability. Thereafter, the output signal 9o is transmitted to a plurality of circuits located inside and outside the internal block circuit 4.

Operation of the IC chip 100 will now be explained in detail with reference to FIG. 19. Reference symbols A, A1, A2, A3, B, B1, B2, C1, C2, D, D1, D2, D3, E, E1, E2 and E3 denote signal data of "1" or "0". Reference characters tda, tdb, tdc, tdd and tde denote delay time of data. Reference symbols (i−1), i, and (i+1) denote periods. Reference symbols 9(i−1), 9i, and 9(i+1) denote output values of the driver circuit 9 in the period (i−1), period i, and period (i+1), respectively.

First, data of signals a to e received by the internal block circuit 4 are latched by a falling edge of the clock signal 5o in the (i−1) period. Since at this time the signals a to e are latched by the same clock signal 5o, the output signals 6a to 6e simultaneously change to "A1", "B", "C1", "D1" and "E".

Data of the flip-flop circuits 6 are passed through individual paths in the internal block circuit 7 and output. When output from the internal block circuit 7, therefore, the delay times tda, tdb, tdc, tdd and tde of respective paths are added. In other words, the output signals 7a to 7e of the internal block circuit 7 changes to data "A1", "B", "C1", "D1" and "E" at respective time points.

Subsequently, data output from the internal block circuit 7 are assembled in the composite gate circuit 8 to produce the signal 8o. Furthermore, the signal 8o is converted in the driver circuit 9 to the signal 9o having predetermined drive capability. Thereafter, the signal 9o is transmitted to a plurality of circuits provided inside and outside the internal block circuit 4.

When different delay times are added to a plurality of synchronized signals because of difference in path as in the above described conventional semiconductor circuit apparatus, however, there is a possibility that, for example, the output signal 8o of the composite gate circuit 8 of a subsequent stage will operate irregularly depending upon changes of the input signals until changes of all input signals are completed. Furthermore, an irregular change of the output signal 8o is also propagated/reflected to the output signal 9o of the driver circuit 9 following the composite gate circuit 8, and thereafter the change is propagated to all subsequent circuits.

In this way, in the conventional semiconductor integrated device, the above described irregularly changing signal is propagated to all subsequent circuits. Although the signal change is unnecessary in the circuit operation, charge and discharge currents flow as a result of this signal change, resulting in a problem.

Furthermore, since the unnecessary signal change is propagated to all subsequent circuits as described above, the charge and discharge currents disadvantageously increase as the semiconductor integrated device as a whole becomes large in scale and high in performance.

SUMMARY OF THE INVENTION

It is an object of this invention to provide a semiconductor integrated device capable of reducing the charge and discharge currents which are unnecessary for circuit operation, and reducing the power dissipation of the apparatus as a whole.

The semiconductor integrated device according to this invention comprises a control circuit disposed to cope with time difference caused in changes of a plurality of signals by difference in routes. This control circuit outputs a received signal in a definite data interval when changes of all signals have been completed, and outputs a fixed signal irrespective of a signal level of a received signal in an indefinite data interval when changes of all signals have not been completed. The control circuit thus prevents irregular signal changes caused by the time difference before definition of data from being prevented to subsequent circuits.

The method of designing a semiconductor integrated device according to this invention comprises the steps of setting conditions of disposition locations of a control circuit beforehand, searching circuit components and signal operations satisfying the conditions at time of work on CAD, and disposing the control circuit, in response to existence of circuit components and signal operations satisfying the conditions.

Other objects and features of this invention will become apparent from the following description with reference to the accompanying drawings.

DESCRIPTION OF THE PREFERRED EMBODIMENTS

Preferred embodiments of a semiconductor integrated device according to the present invention will be described in detail by referring to the accompanying drawing. By the way, the present invention is not limited by the embodiments.

Figure 1:
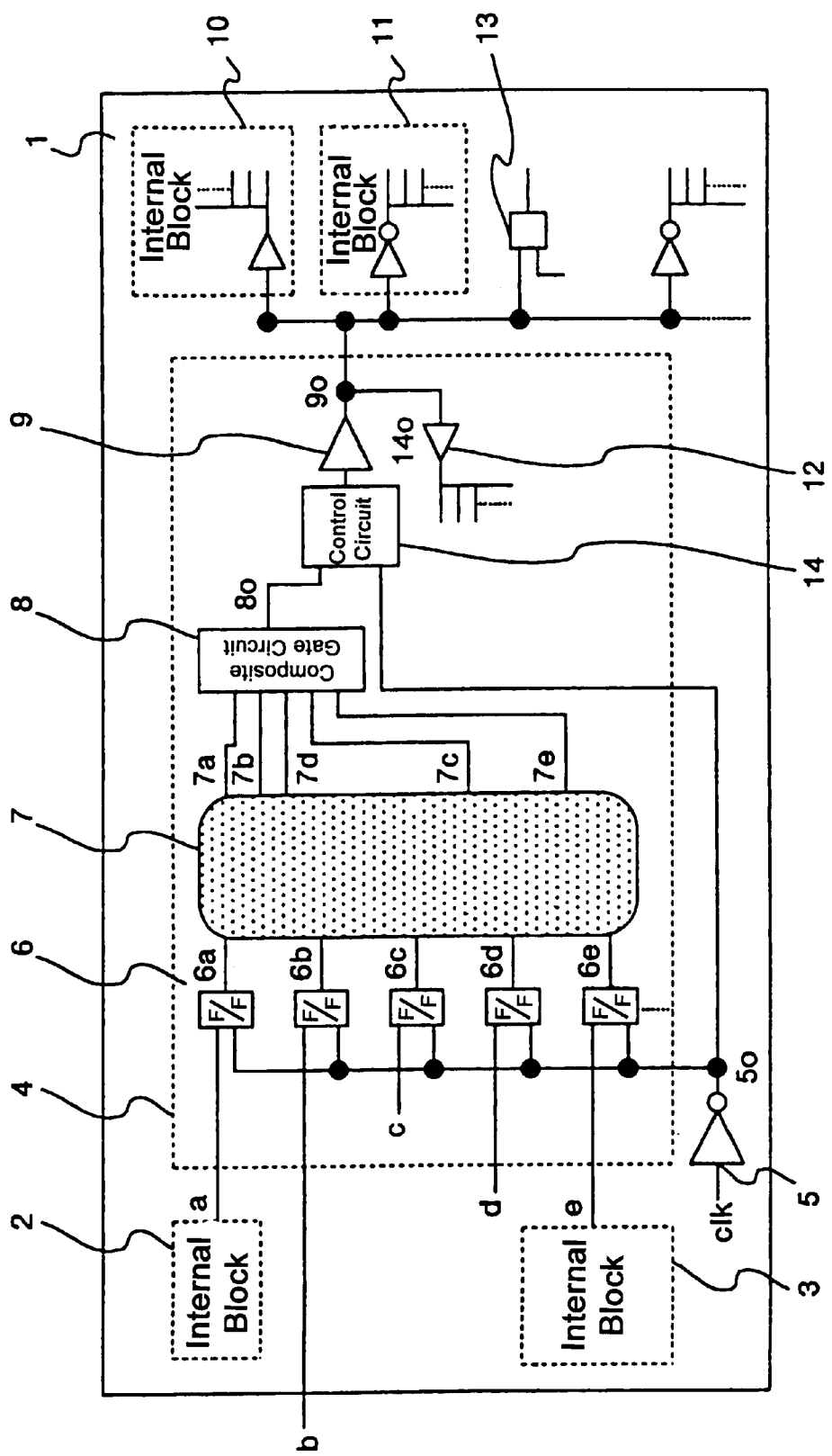
FIG. 1 is a diagram showing a configuration of a semiconductor integrated device according to a first embodiment of the present invention.

FIG. 1 is a diagram showing a configuration of a semiconductor integrated device according to a first embodiment of the present invention. In FIG. 1, Reference numeral 1 denotes an IC chip made of a CMOS device. Reference numerals 2, 3, 4, 10 and 11 denote independent internal block circuits included in the IC chip 1. Reference numeral 5 denotes an inverter circuit functioning as a driver of clk. Reference numeral 6 denotes a plurality of flip-flop circuits. Reference numeral 7 denotes an internal block circuit included in the internal block circuit 4. Reference numerals 8 and 13 denote composite gate circuits (which may be internal block circuits). Reference numerals 9 and 12 denote driver circuits. Reference numeral 14 denotes a control circuit disposed between the composite gate circuit 8 and the driver circuit 9. Reference symbols a, b, c, d, e, clk, 5o, 6a, 6b, 6c, 6d, 6e, 7a, 7b, 7c, 7d, 7e, 8o, 9o and 14o denote signals.

For example, the power dissipation of the above described IC chip 1 is determined by charge and discharge currents of transistors let flow in order to activate the circuits included in the IC chip, through currents of transistors flowing at the time of operation of the IC, leak currents of transistors flowing at the time of standstill of the IC, and so on. In the first embodiment, therefore, there will be described a semiconductor integrated device corresponding to a fast, highly integrated and large scale IC, and capable of reducing the charge and discharge currents required to activate the IC together with the through currents and the leak currents.

First of all, in the IC chip 1, for example, signals such as the signal a output from the internal block circuit 2, the signal b input from the outside, the signal c generated within the internal block circuit 4, the signal d generated outside the internal block circuit 4, the signal e output from the internal block circuit 3 are individually output to the flip-flop circuits 6. The flip-flop circuits 6 latch the received signal at a falling edge of a clock signal 5o received via the inverter circuit 5.

Upon receiving output signals 6a to 6e of respective flip-flop circuits 6, the internal block circuit 7 outputs output signals 7a to 7e respectively passed through individual paths. Upon receiving output signals 7a to 7e of the internal block circuit 7, the composite gate circuit 8 outputs a signal 8o assembled therein.

Upon receiving the output signal 8o of the composite gate circuit 8, the control circuit 14 removes an indefinite component caused by delay difference values of the signals 7a to 7e included in the signal 8o, according to a control signal generated on the basis of the clock signal 5o. Moreover, the control circuit 14 outputs a signal 14o with the indefinite component removed. Upon receiving the signal 14o, the driver circuit 9 outputs a signal 9o having predetermined drive capability. Thereafter, the output signal 9o is transmitted to a plurality of circuits located inside and outside the internal block circuit 4.

Figure 2:
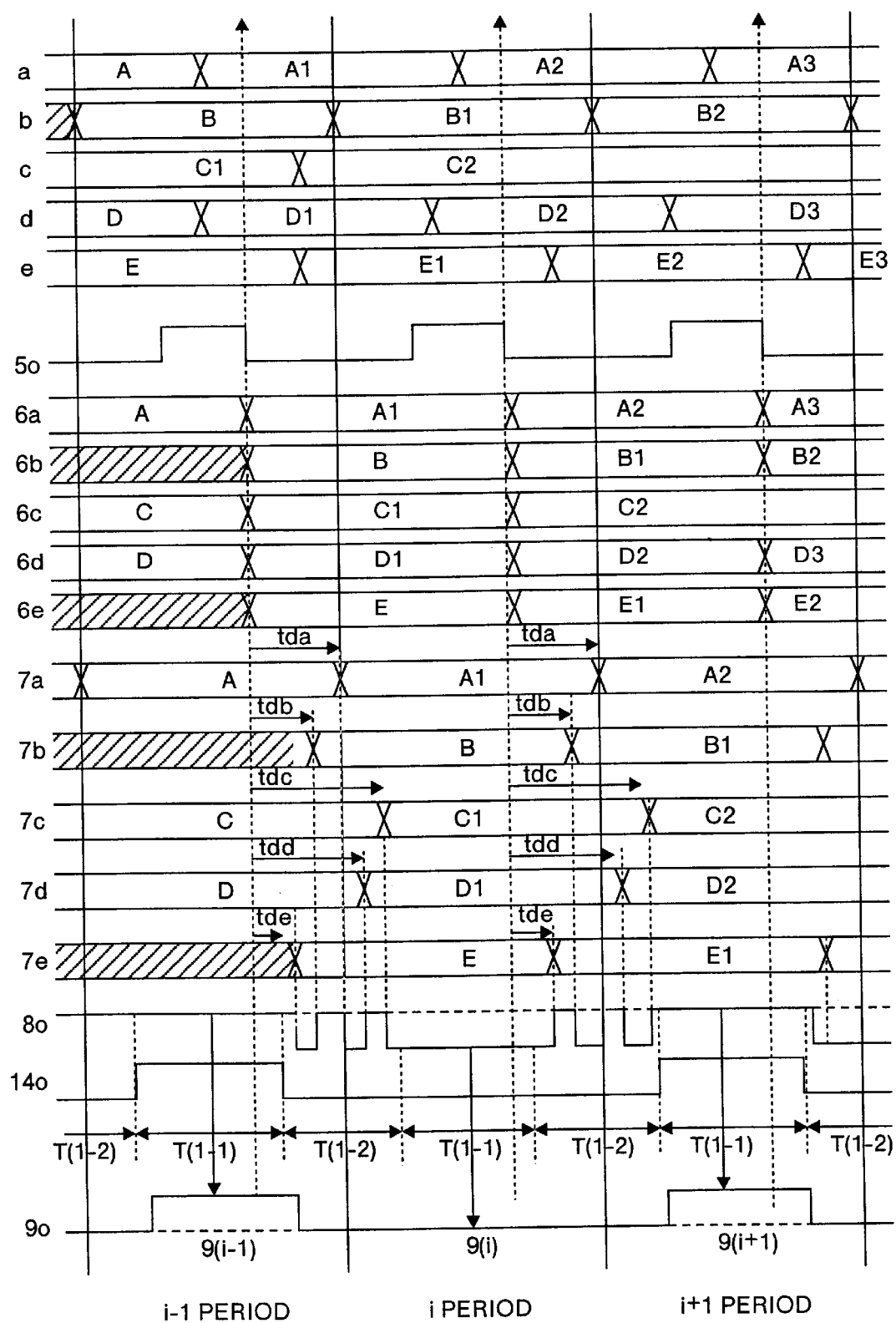
FIG. 2 is a time chart showing operation of the semiconductor integrated device according to the first embodiment.

Operation of the IC chip 1 will be described in detail with reference to FIG. 2. Reference symbols A, A1, A2, A3, B, B1, B2, C1, C2, D, D1, D2, D3, E, E1, E2 and E3 denote signal data of "1" or "0". Reference characters tda, tdb, tdc, tdd and tde denote delay time of data. Reference symbols (i−1), i, and (i+1) denote periods. Reference symbols 9(i−1), 9i, and 9(i+1) denote output values of the driver circuit 9 in the period (i−1), period i, and period (i+1), respectively. Reference symbols T(1-1) and T (1-2) denote control intervals generated by a control signal.

First, data of signals a to e received by the internal block circuit 4 are latched by a falling edge of the clock signal 5o in the (i−1) period. Since at this time the signals a to e are latched by the same clock signal 5o, the output signals 6a to 6e simultaneously change to "A1", "B", "C1", "D1" and "E".

Data of the flip-flop circuits 6 are passed through individual paths in the internal block circuit 7 and output. When output from the internal block circuit 7, therefore, the delay times tda, tdb, tdc, tdd and tde of respective paths are added. In other words, the output signals 7a to 7e of the internal block circuit 7 changes to data "A1", "B", "C1", "D1" and "E" at respective time points.

Subsequently, data output from the internal block circuit 7 are assembled in the composite gate circuit 8 to produce the signal 8o. At this time, time difference is caused in change timing of the input signals 7a to 7e of the composite gate circuit 8 by difference in the paths. Until changes of all input signals are completed, the output signal 8o of the composite gate circuit 8 changes irregularly according to changes of the input signals. In other words, an indefinite component is included in the output signal 8o.

Upon receiving the output signal 8o, the control circuit 14 outputs the signal 8o fed from the composite gate circuit 8 as the signal 14o, as it is during the interval T(1-1) and outputs the fixed signal 14o irrespective of the signal level of the signal 8o during the interval T(1-2), according to the control signal generated on the basis of the clock signal 5o. Furthermore, the signal 14o is converted in the driver circuit 9 to the signal 9o having predetermined drive capability. Thereafter, the signal 9o is transmitted to a plurality of circuits provided inside and outside the internal block circuit 4. As shown in FIG. 2, the interval T(1-2) is not necessarily synchronized with the clock signal 5o.

Thus, in the semiconductor integrated device according to the first embodiment, there is provided a control circuit having the following configuration. That is, when time difference is caused in change timing of a plurality of signals by difference in the paths, the control circuit outputs the received signal as it is during an interval having no possibility of a signal change, i.e., a definite data interval, whereas the control circuit outputs the fixed signal irrespective of the signal level of the received signal during an interval having a possibility of a change of at least one signal, i.e., an indefinite data interval. Owing to such a configuration, propagation of unnecessary signal changes occurring in the conventional technique can be prevented. As a result, the charge and discharge currents of the whole apparatus can be reduced remarkably. Furthermore, for the same reason, the power dissipation of the whole apparatus can also be reduced remarkably.

Furthermore, in the semiconductor integrated device according to the first embodiment, not only the charge and discharge currents can be reduced, but also operation of transistors caused by unnecessary signal changes is eliminated. In other words, unnecessary switchover operation of a PMOS transistor and an NMOS transistor from "ON" to "OFF" and vice versa is eliminated. As a result, a through current occurring when both transistors are "ON" can also be reduced.

Figure 3:
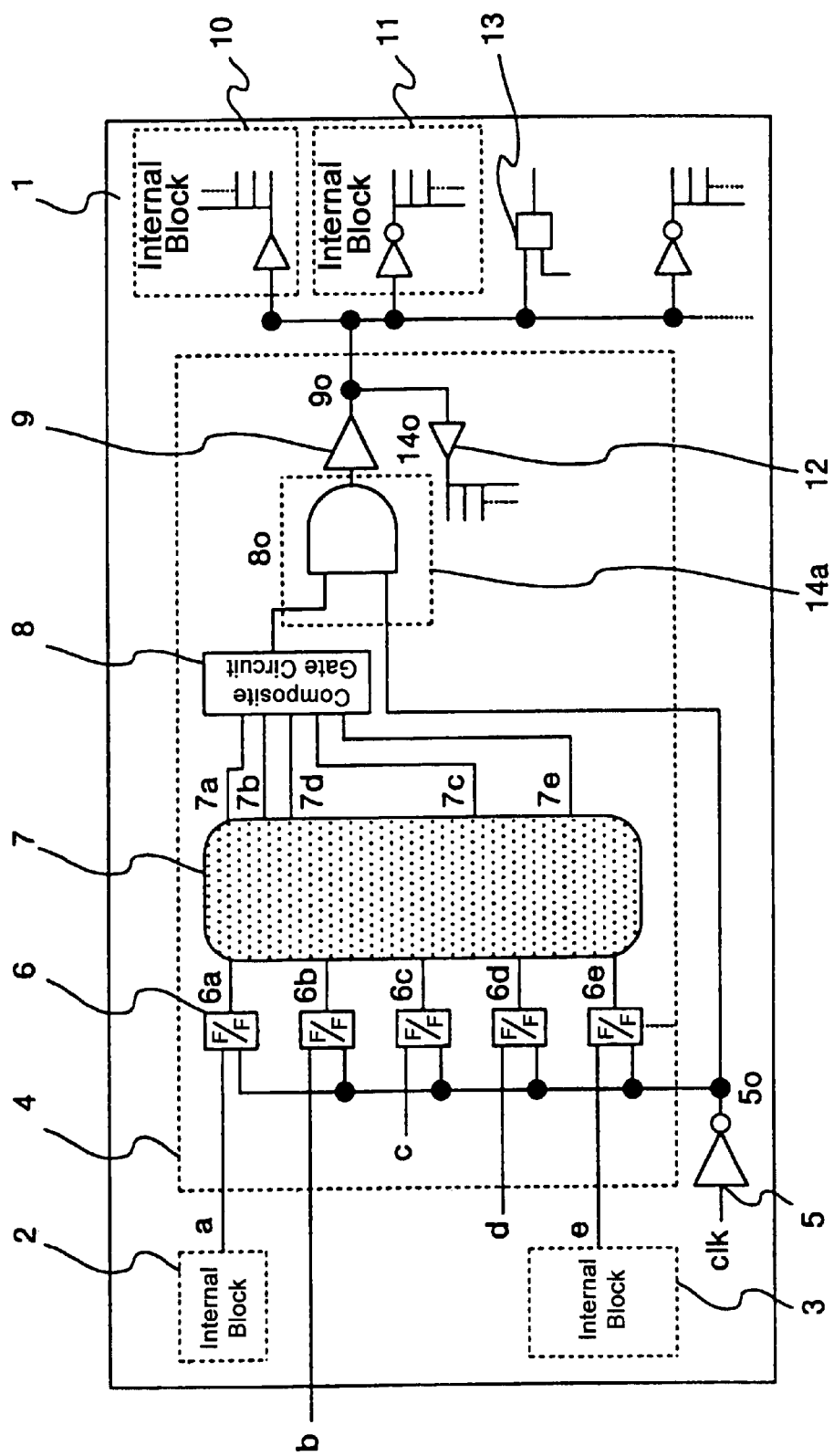
FIG. 3 is a diagram showing a configuration of a semiconductor integrated device according to a second embodiment of the present invention.

FIG. 3 is a diagram showing a configuration of a second embodiment of a semiconductor integrated device according to the present invention. The same components as those of the above described first embodiment are denoted by like characters, and description thereof will be omitted. Reference symbol 14a denotes a concrete example of the control circuit 14 described above, and it is a control circuit formed of an AND gate. Precisely, this control circuit 14a is formed of a 2-input AND gate circuit. A first input terminal of the AND gate circuit is supplied with the output signal 8o of the composite gate circuit 8. A second input terminal of the AND gate circuit is supplied with the clock signal 5o. The output signal 14o of the control circuit 14a is supplied to the driver circuit 9 at the later stage.

Figure 4:
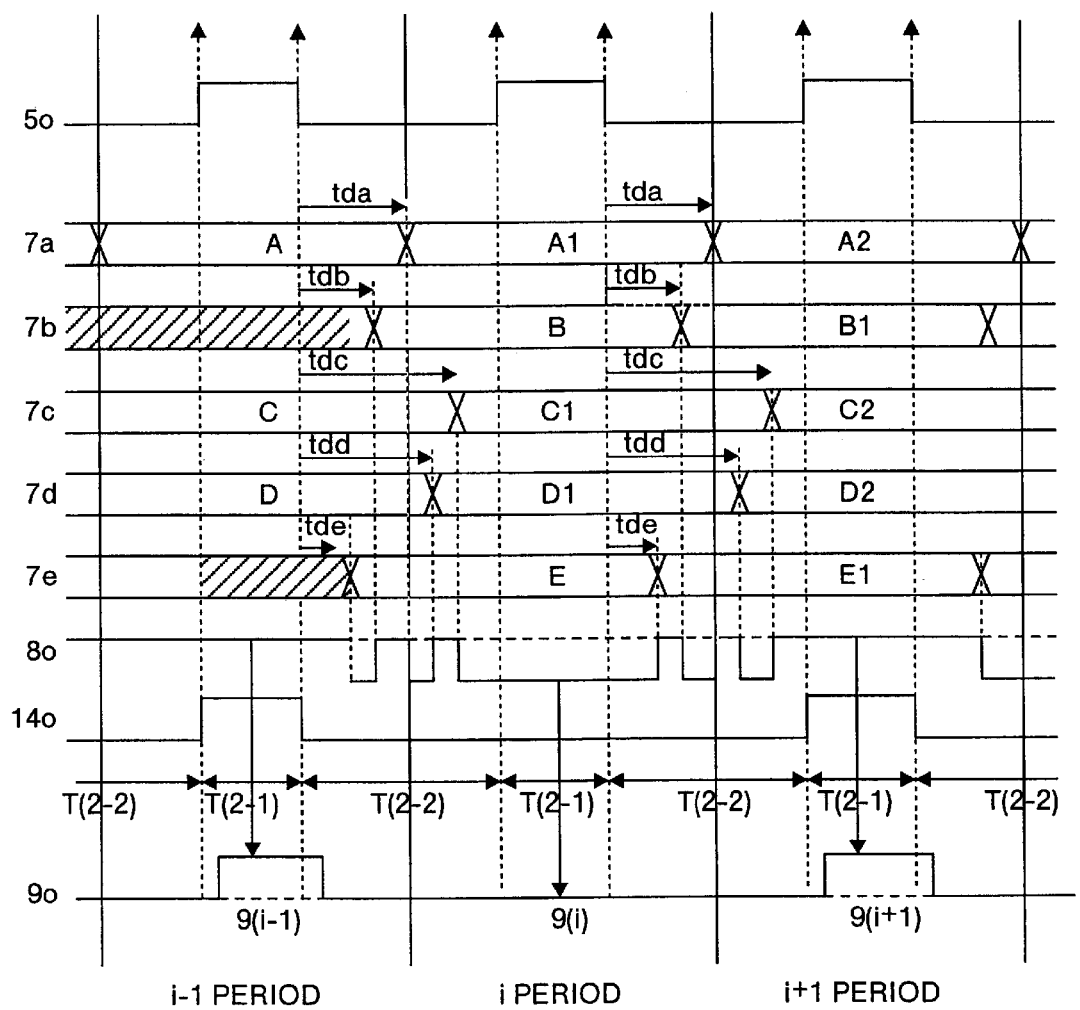
FIG. 4 is a time chart showing operation of the semiconductor integrated device according to the second embodiment.

Characteristic features of the operation of the IC chip according to the second embodiment will now be described in detail with reference to FIG. 4. However, only operation which is different from that of the first embodiment described earlier will be described. In should be noted that, reference symbols T(2-1) and T(2-2) represent control intervals generated by a control signal.

The control circuit 14a (AND gate) receives the output signal 8o of the composite gate circuit 8 and the clock signal 5o serving as a control signal. During the interval T(2-1) with the clock signal 5o being high logical level ("H"), the control circuit 14a outputs the input signal 8o as it is. During the interval T(2-2) with the clock signal 5o being low logical level ("L"), the control circuit 14a outputs "L" irrespective of the signal level of the input signal 8o. As a result, an unnecessary component (indefinite component) in the input signal 8o can be removed.

Thus, in semiconductor integrated device according to the second embodiment, it is determined according to the state of the clock signal 5o serving as the control signal whether the signal input to the control circuit should be output as it is or a fixed signal should be output irrespective of the signal level of the input signal. Propagation of unnecessary signal changes is thus prevented. As a result, effects similar to those of the first embodiment are obtained. In addition, by setting the duty cycle to such a value (for example, 30% in FIG. 4)

that an indefinite component of the input signal can be removed, only the signal of the definite interval can be output certainly.

Figure 5:
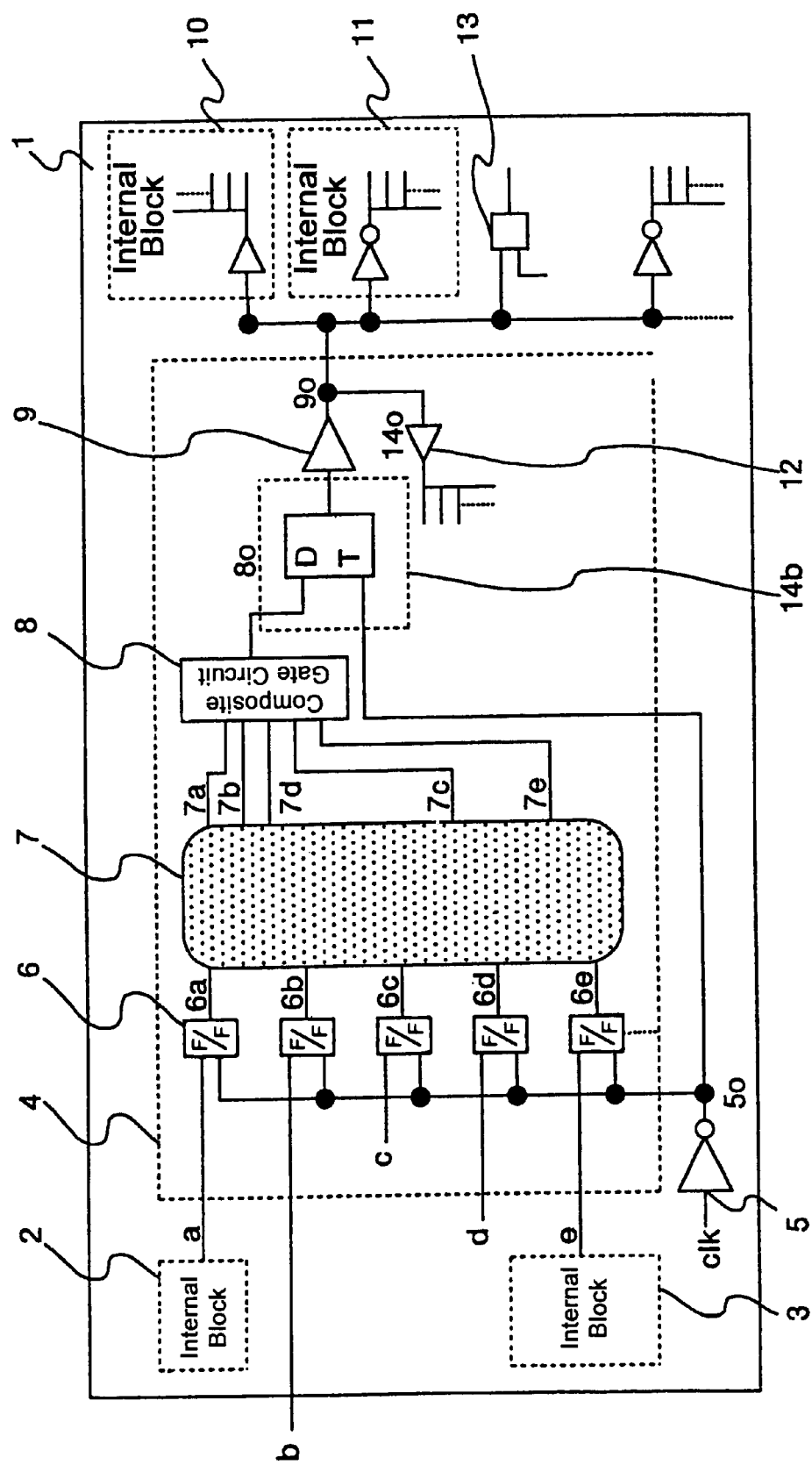
FIG. 5 is a diagram showing a configuration of a semiconductor integrated device according to a third embodiment of the present invention.

FIG. 5 is a diagram showing a configuration of a semiconductor integrated device according to a third embodiment of the present invention. The same components as those of the above described first embodiment are denoted by like characters, and description thereof will be omitted. Reference symbol 14b denotes a concrete example of the control circuit 14 described above. Precisely, this control circuit 14b is formed of a latch circuit. The control circuit 14b is formed of a D latch circuit. A first terminal D of the D latch circuit serving as a data terminal is supplied with the output signal 8o of the composite gate circuit 8. A second terminal T of the D latch circuit serving as a clock terminal is supplied with the clock signal 5o. The output signal 14o of the control circuit 14b is supplied to the following driver circuit 9.

Figure 6:
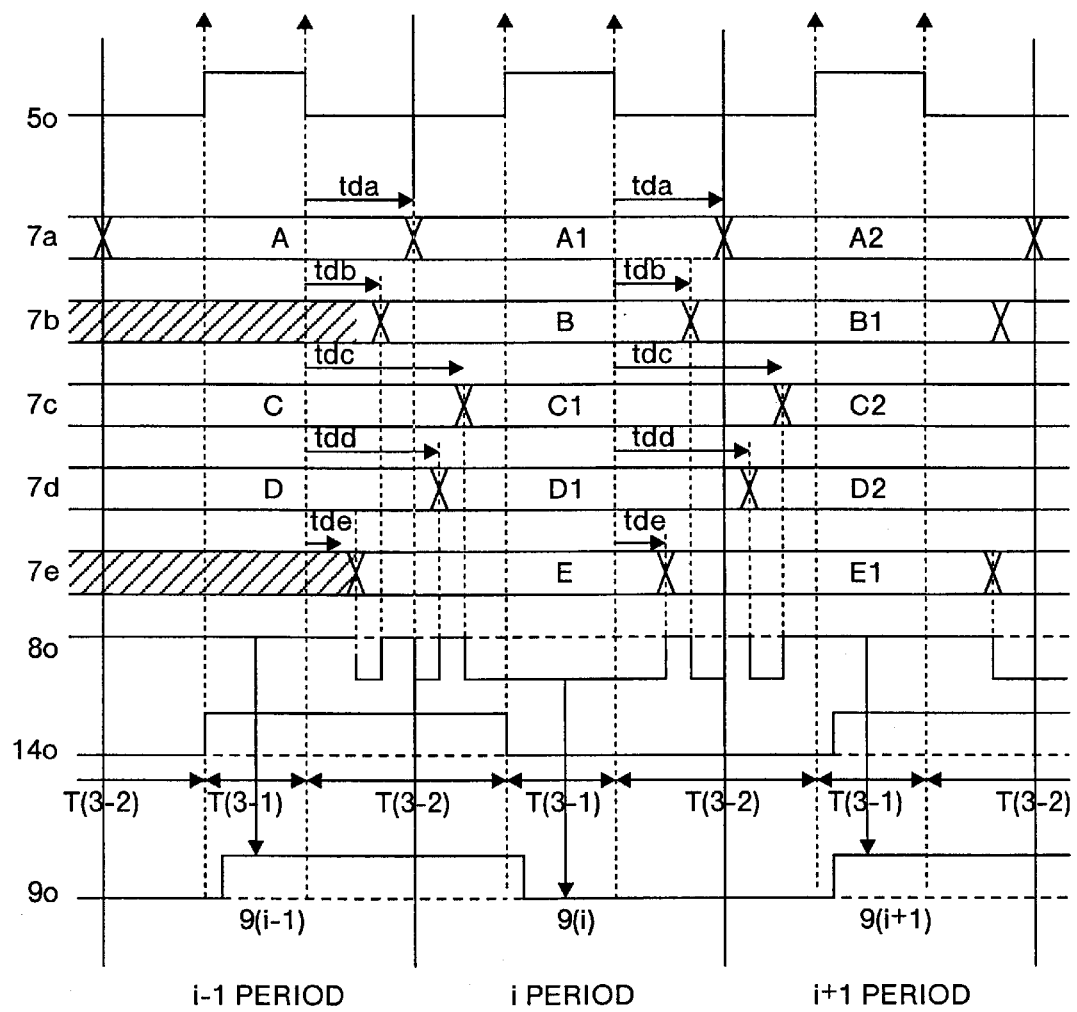
FIG. 6 is a time chart showing operation of the semiconductor integrated device according to the third embodiment.

Characteristic features of the operation of the IC chip according to the third embodiment will now be described in detail with reference to FIG. 6. Only operation which is different from that of the first embodiment described earlier will be described. In FIG. 6, reference symbol T(3-1) and T(3-2) represent control intervals generated by a control signal.

The control circuit 14b (D latch circuit) receives the output signal 8o (data terminal D) of the composite gate circuit 8 and the clock signal 5o (clock terminal T) serving as a control signal. At a rising edge of the clock signal 5o, the control circuit 14b (D latch circuit) outputs the received input signal 8o, and holds the output over the intervals T(3-1) and T(3-2). As a result, an unnecessary component (indefinite component) in the input signal 8o can be removed.

Thus, in semiconductor integrated device according to the third embodiment, the input signal is latched at a rising edge of the clock and held until the next rising edge. Propagation of unnecessary signal changes is thus prevented. As a result, effects similar to those of the first embodiment are obtained. In addition, by causing the rising edge of the clock always in a definite data interval, i.e., in such a position that an indefinite component of the input signal can be removed, only the signal of the definite interval can be output certainly.

Figure 7:
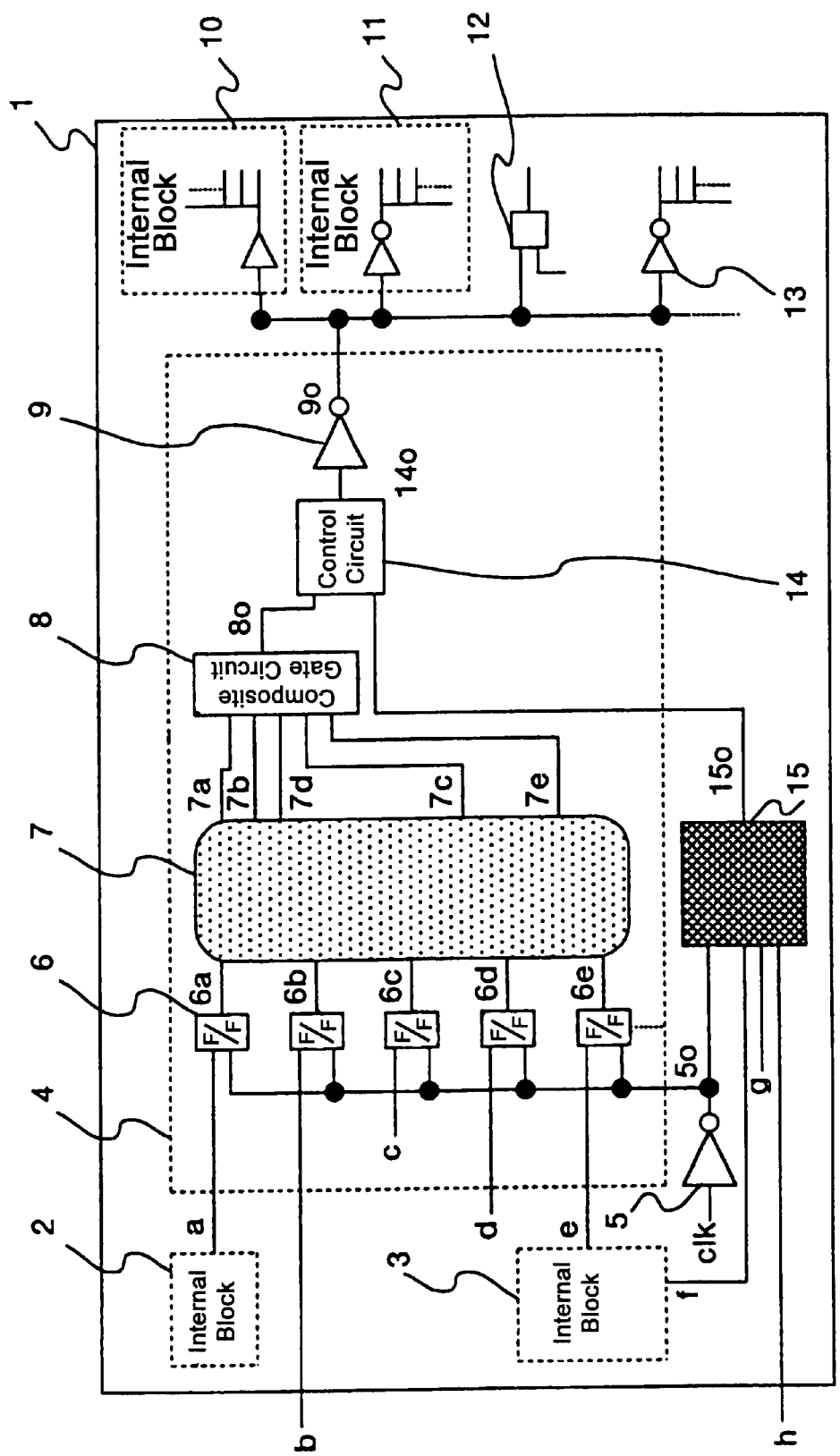
FIG. 7 is a diagram showing a configuration of a semiconductor integrated device according to a fourth embodiment of the present invention.

FIG. 7 is a diagram showing a configuration of a semiconductor integrated device according to a fourth embodiment of the present invention. The same components as those of the above described first embodiment are denoted by like characters, and description thereof will be omitted. In FIG. 7, reference symbol 15 denotes a control signal generation circuit for generating a control signal on the basis of a plurality of signals such as the clock signal 5o, signals f, g fed from other internal block circuits, and a signal h input from the outside, and 15o denotes the generated control signal.

Thus, in semiconductor integrated device according to the fourth embodiment, the control signal is generated on the basis of a plurality of signals such as the clock signal, signals fed from other internal block circuits, and an external input signal. The control interval can be freely set according to various conditions irrespective of the clock signal. As compared with the foregoing embodiments, therefore, the propagation signal can be controlled in a finer manner. In FIG. 7, the control signal generation circuit 15 has been applied to the configuration of the first embodiment. However, the control signal generation circuit 15 is not restricted to the configuration of the first embodiment, but it can be applied the configuration of the second embodiment or the configuration of the third embodiment as well.

Figure 8:
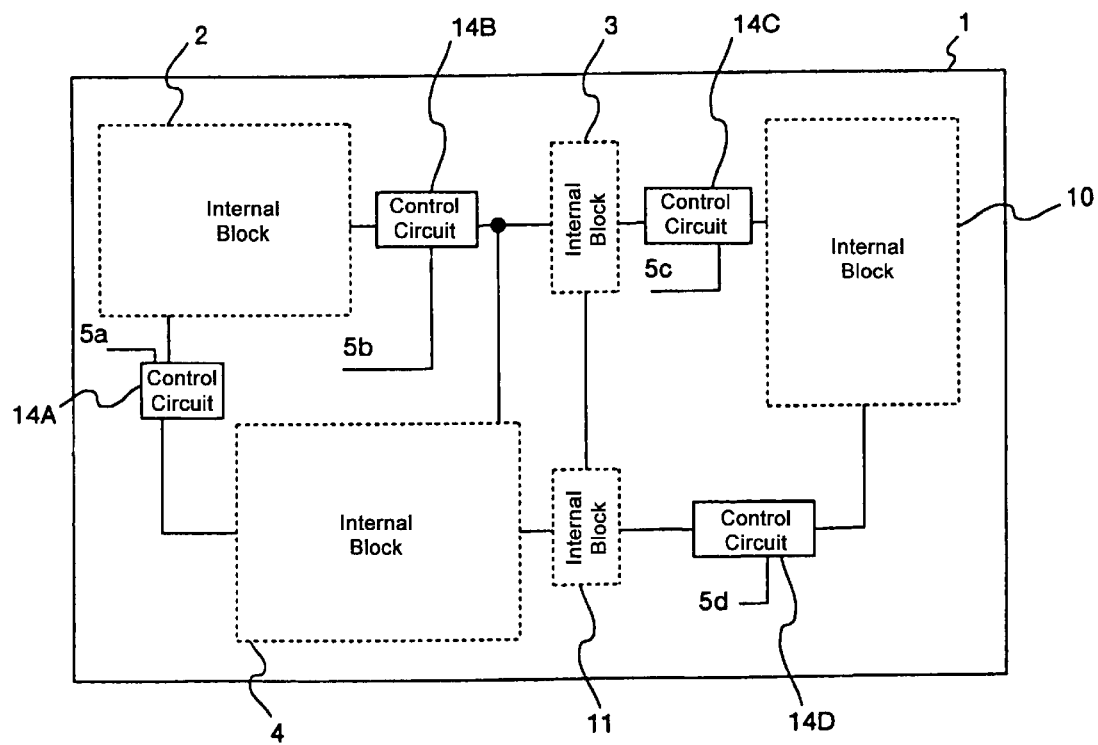
FIG. 8 is a diagram showing a configuration of a semiconductor integrated device according to a fifth embodiment of the present invention.

FIG. 8 is a diagram showing a configuration of a semiconductor integrated device according to a fifth embodiment of the present invention. The same components as those of the above described first to fourth embodiments are denoted by like characters, and description thereof will be omitted. In FIG. 8, reference symbols 14A, 14B, 14C and 14D denote a control circuit described with reference to one of the first to third embodiments, and reference symbols 5a, 5b, 5c and 5d denote control signals for controlling the control circuits 14A, 14B, 14C and 14D, respectively.

In the fifth embodiment, the control circuits are disposed in a stage preceding the large-scale internal block circuit 2, in a stage preceding the internal block circuits 3 and 4, in a stage preceding the internal block circuit 10, and in a stage preceding the internal block circuit 11. The plurality of control circuits are formed so as to be capable of being controlled individually by independent control signals 5a to 5d. While the control signals are provided individually here, the same control signal may also be used. Operation of each of the control circuits is similar to that explained with reference to FIG. 2, FIG. 4 or FIG. 6 described earlier, and description thereof will be omitted.

Thus, in semiconductor integrated device according to the fifth embodiment, effects similar to those of the first to fourth embodiments described earlier are obtained. In addition, since control circuits are disposed in stages preceding comparatively large scale internal clock circuits, propagation of unnecessary signal changes can be reduced by taking a block as the unit. Furthermore, since the number of control circuits is kept at a required minimum, increase in scale of the chip size can be prevented.

FIG. 9 to FIG. 12 are diagrams for explaining the characteristic features of a semiconductor integrated device according to a sixth embodiment. Components of the present embodiment are the same as those of the above described first to fifth embodiments. Therefore, the components of the present embodiment are denoted by like characters, and description thereof will be omitted.

Figure 9:
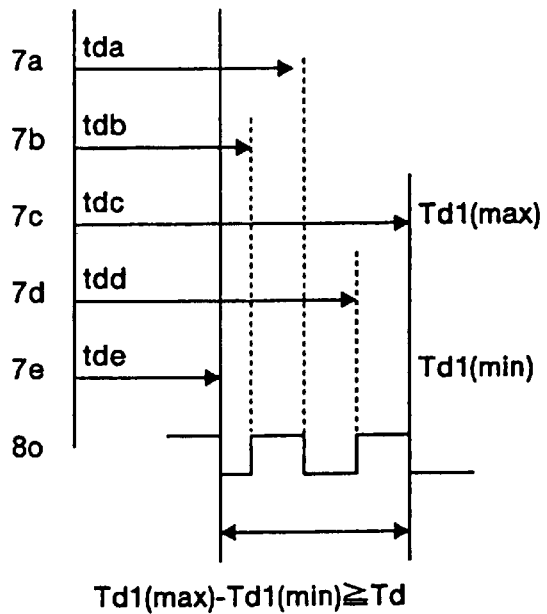
FIG. 9 is a diagram showing characteristic features of a semiconductor integrated device according to a sixth embodiment of the present invention.
Figure 10:
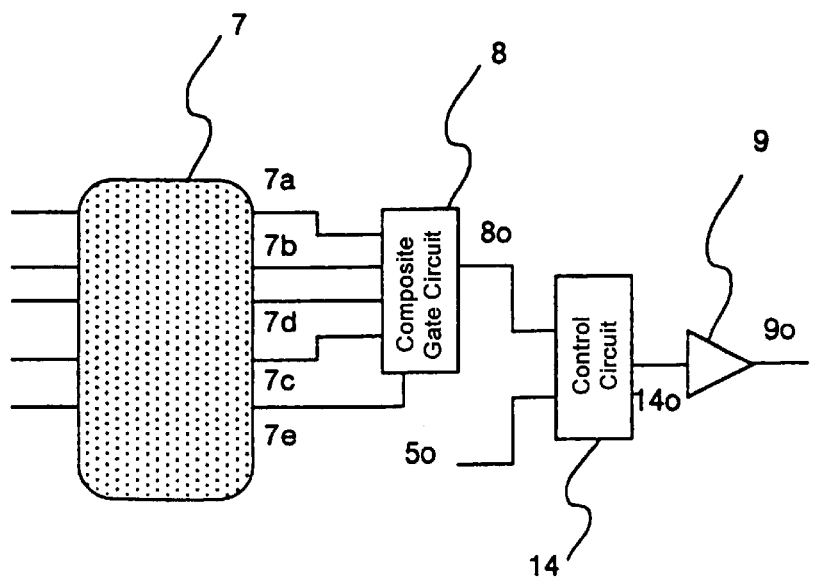
FIG. 10 is another diagram showing characteristic features of a semiconductor integrated device according to a sixth embodiment of the present invention.
Figure 11:
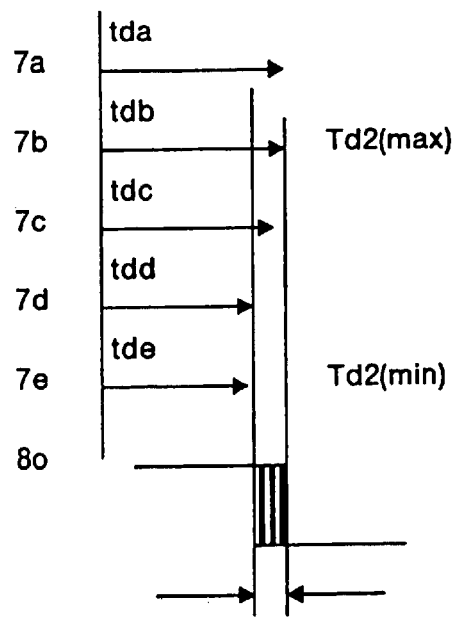
FIG. 11 is still another diagram showing characteristic features of a semiconductor integrated device according to a sixth embodiment of the present invention.
Figure 12:
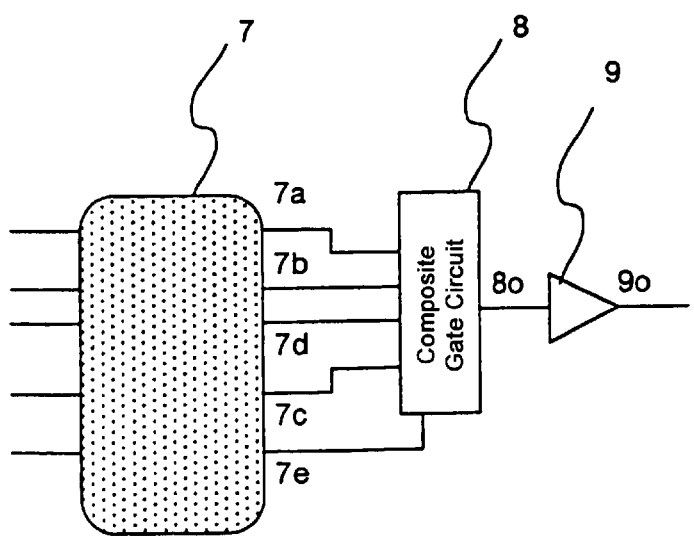
FIG. 12 is still another diagram showing characteristic features of a semiconductor integrated device according to a sixth embodiment of the present invention.

In FIG. 9 and FIG. 11, reference symbols tda, tdb, tdc, tdd and tde denote data delay times of signals 7a to 7e of FIGS. 10 and 12, respectively. Reference symbols Td1(min) and Td2(min) denote the shortest delay time among the delay times tda to tde, respectively. Reference symbols Td1(max) and Td2(max) denote the longest delay time among the delay times, respectively. Reference character Td denotes a time serving as a decision criterion (threshold) as to whether a control circuit should be disposed.

Characteristic features of the operation of the IC chip according to the sixth embodiment will now be described in detail with reference to FIG. 9 to FIG. 12. For example, when difference values among delay times of the signals 7a to 7e input to the composite gate circuit 8 are great as shown in FIG. 9, the composite gate circuit 8 changes according to changes of the input signals. At this time, charge and discharge currents flow through the composite gate circuit 8 according to signal changes. In addition, unnecessary signal changes are propagated to subsequent circuits, and charge and discharge currents flow through the subsequent circuits.

On the other hand, when difference values among delay times of the signals 7a to 7e input to the composite gate circuit 8 are small as shown in FIG. 11, the output signal 8o becomes definite in a very short time in the composite gate circuit 8 and charge and discharge currents are not generated by an indefinite component.

In the sixth embodiment, therefore, a control circuit is not disposed as shown in FIG. 12 when difference values among delay times of the signals input to the composite gate circuit 8 are small as shown in FIG. 11, whereas a control circuit 14 (which may be 14a or 14b) is disposed as shown in FIG. 10 when difference values among delay times of the signals input to the composite gate circuit 8 are great as shown in FIG. 9. In other words, it is determined on the basis of difference values among delay times of the signals input to the composite gate circuit 8 in the sixth embodiment whether the control circuit should be disposed.

To be concrete, the time Td serving as the decision criterion as to whether a control circuit should be disposed is set beforehand. The shortest delay time Td(min) and the longest delay time Td(max) among the delay times tda to tde of signals input to the composite gate circuit 8 are measured. A difference between them, i.e., (Td(max)−Td(min)) is compared with the decision criterion time Td. For example, if $$Td(max)-Td(min) \geq Td,$$

then a control circuit is disposed on the output side of the composite gate circuit 8. If $$Td(max)-Td(min) < Td,$$

then a control circuit is not disposed. By the way, the decision criterion time Td is arbitrary. For example, the decision criterion time Td may be set to the operation speed of the composite gate circuit 8.

Thus, in the sixth embodiment, a control circuit is not disposed on the output side of the composite gate circuit when difference values among delay times of the signals input to the composite gate circuit are small, whereas a control circuit is disposed on the output side of the composite gate circuit when difference values among delay times of the signals input to the composite gate circuit are great. As a result, effects similar to those of the above described first to fourth embodiments are obtained. In addition, since the disposition location of the control circuit can be selected, disposition of useless control circuits can be prevented and the chip size can be remarkably reduced.

Figure 13:
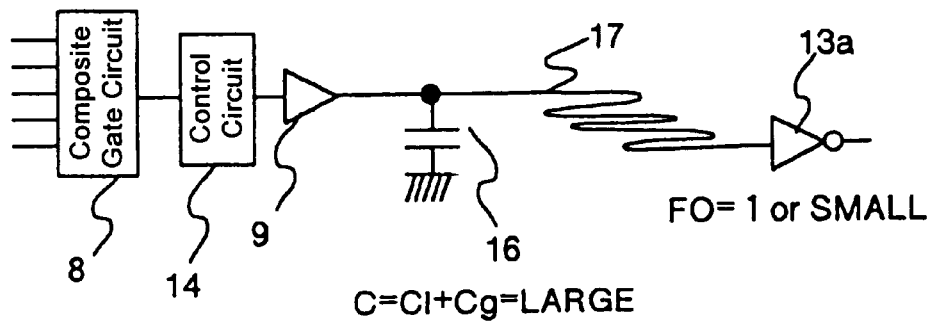
FIG. 13 is a diagram showing characteristic features of a semiconductor integrated device according to a seventh embodiment of the present invention.

FIG. 13 is a diagram for explaining the characteristic features of a semiconductor integrated device according to a seventh embodiment. Basic components of the present embodiment are the same as those of the above described first to fifth embodiments. Therefore, the components of the present embodiment are denoted by like characters, and description thereof will be omitted. In FIG. 13, reference symbol 13a denotes an inverter circuit connected to the driver circuit 9. Reference numeral 16 denotes load capacitance of the output of the driver circuit 9. Reference numeral 17 denotes wiring between the driver circuit 9 and the inverter circuit 13.

Characteristic features of the IC chip according to the seventh embodiment will now be described in detail with reference to FIG. 13. For example, when wiring becomes very long between specific circuits to which the output signal of the composite gate circuit 8 is propagated, a control circuit 14 (which may also be 14a or 14b) is connected to the output of the composite gate circuit 8, in the present embodiment. In other words, when wiring 17 for propagating the output signal of the composite gate circuit 8 between the driver circuit 9 and the inverter circuit 13 is very long disposition wiring, a control circuit is provided on the output side of the composite gate circuit 8 as shown in FIG. 13.

Load capacitance C of the output of the driver circuit 9 becomes the sum of output wiring capacitance C1 of the driver circuit 9 and input gate capacitance Cg of the inverter circuit 13a connected to the driver circuit 9, and it can be represented by the following equation.

$$C=C1+Cg \qquad (2)$$

Therefore, power dissipation P at the time of operation of the driver circuit 9 is represented by the following equation.

$$P=(\tfrac{1}{2}) Cv=(\tfrac{1}{2}) (C1+Cg) V^2 \qquad (3)$$

As the load capacitance becomes smaller, the charge and discharge currents flowing at the time of operation of the driver circuit 9 becomes smaller and the current consumption also becomes smaller.

Furthermore, the output wiring capacitance C1 is in proportion to wiring length L. The input gate capacitance Cg is in proportion to the fan-out number (hereafter referred to as FO number) of a circuit connected to the output of the wiring. If the wiring length L between the circuits becomes very long, therefore, then the wiring capacitance C1 increases and the power dissipation of the composite gate circuit itself at the time of operation becomes great even when the FO number is 1 or very small.

Thus, when wiring between specific circuits to which the output signal of the composite gate circuit is propagated becomes longer than a predetermined length and there is such disposition wiring that charge and discharge currents and power dissipation become great, a control circuit is disposed on the output side of the composite gate circuit, in the seventh embodiment. As a result, effects similar to those of the first to fourth embodiments described earlier are obtained. In addition, since the disposition location of the control circuit can be selected, disposition of useless control circuits can be prevented and the chip size can be remarkably reduced.

Figure 14:
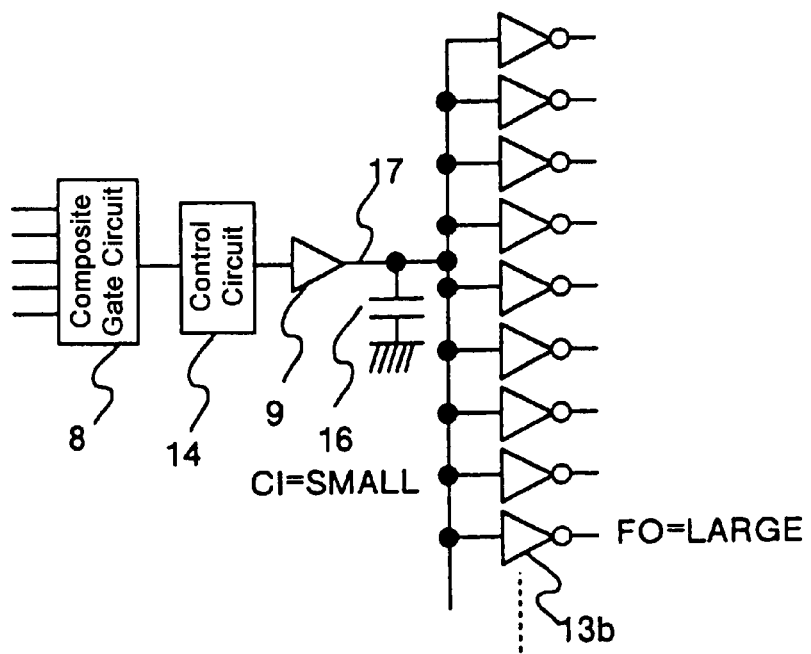
FIG. 14 is a diagram showing characteristic features of a semiconductor integrated device according to an eighth embodiment of the present invention.

FIG. 14 is a diagram for explaining the characteristic features of a semiconductor integrated device according to an eighth embodiment. Basic components of the present embodiment are the same as those of the above described first to fifth and seventh embodiments. Therefore, the components of the present embodiment are denoted by like characters, and description thereof will be omitted. In FIG. 14, reference symbol 13b denotes a plurality of inverter circuits connected to the driver circuit 9.

Characteristic features of the IC chip according to the eighth embodiment will now be described in detail with reference to FIG. 14. For example, when the output signal of the composite gate circuit 8 is propagated to very many circuits, a control circuit 14 (which may also be 14a or 14b) is connected to the output of the composite gate circuit 8, in the present embodiment. In other words, when the output signal of the composite gate circuit 8 is propagated to a plurality of inverter circuit 13b, a control circuit is provided on the output side of the composite gate circuit 8 as shown in FIG. 14.

As shown in the equation (2), load capacitance C of the output of the driver circuit 9 becomes the sum of output wiring capacitance C1 of the driver circuit 9 and input gate capacitance Cg of the inverter circuit 13 connected to the driver circuit 9. Therefore, power dissipation P at the time of operation of the driver circuit 9 is represented by the equation (3) As the load capacitance becomes smaller, the charge and discharge currents flowing at the time of operation of the driver circuit 9 becomes smaller and the current consumption also becomes smaller.

Furthermore, the output wiring capacitance C1 is in proportion to wiring length L. The input gate capacitance Cg is in proportion to the fan-out number (hereafter referred to as FO number) of a circuit connected to the output of the wiring. If the FO number becomes great, therefore, then the wiring capacitance Cg increases and the power dissipation of the composite gate circuit itself at the time of operation becomes great even when the wiring length L is very short.

Thus, when the output signal of the composite gate circuit is propagated to more circuits than a prescribed number of circuits, or the output of the composite gate circuit is connected to a circuit having a very large drive capability, a control circuit is disposed on the output side of the composite gate circuit, in the eighth embodiment. As a result, effects similar to those of the first to fourth embodiments described earlier are obtained. In addition, since the disposition location of the control circuit can be selected, disposition of useless control circuits can be prevented and the chip size can be remarkably reduced.

Figure 15:
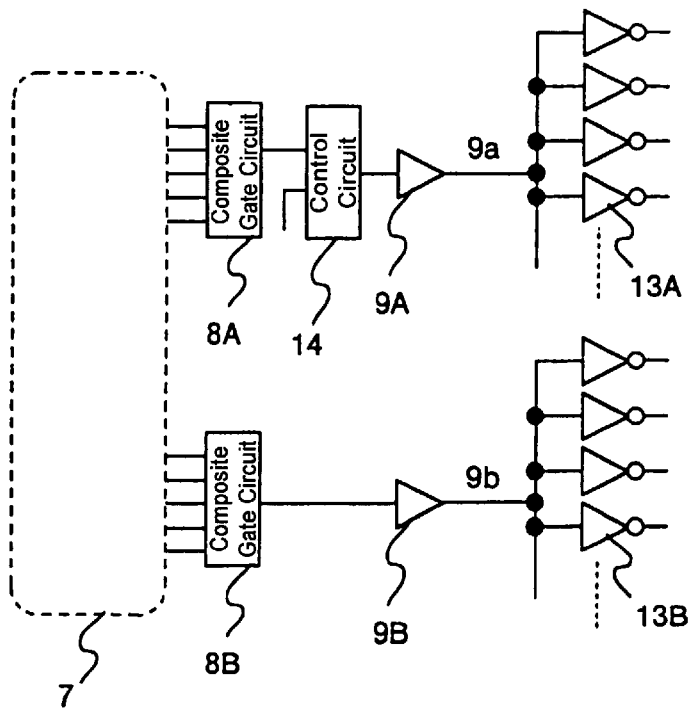
FIG. 15 is a diagram showing characteristic features of a semiconductor integrated device according to a ninth embodiment of the present invention.
Figure 16:
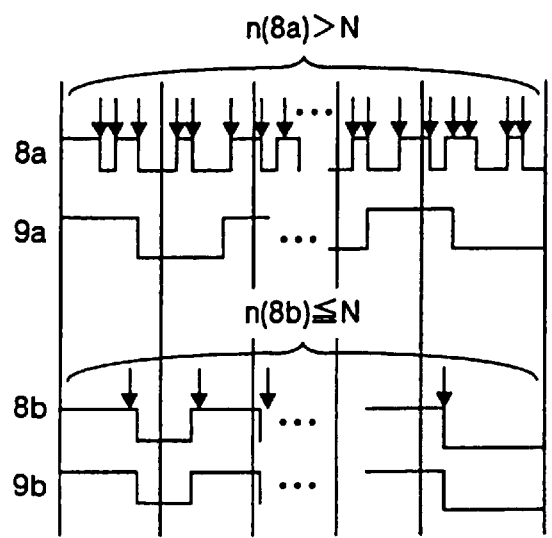
FIG. 16 is another diagram showing characteristic features of a semiconductor integrated device according to a ninth embodiment of the present invention.
Figure 17:
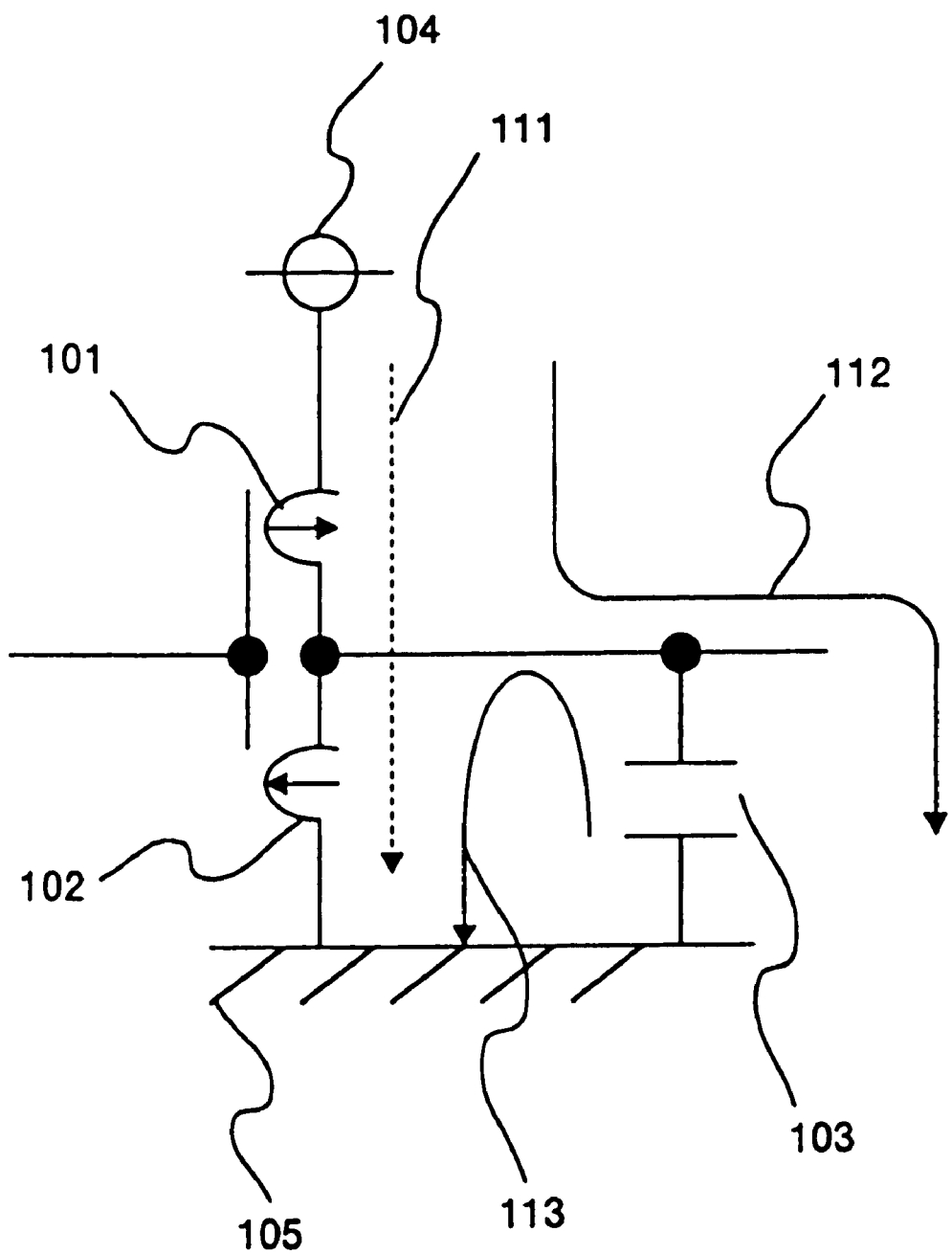
FIG. 17 is a diagram showing a current path of a conventional CMOS circuit.
Figure 18:
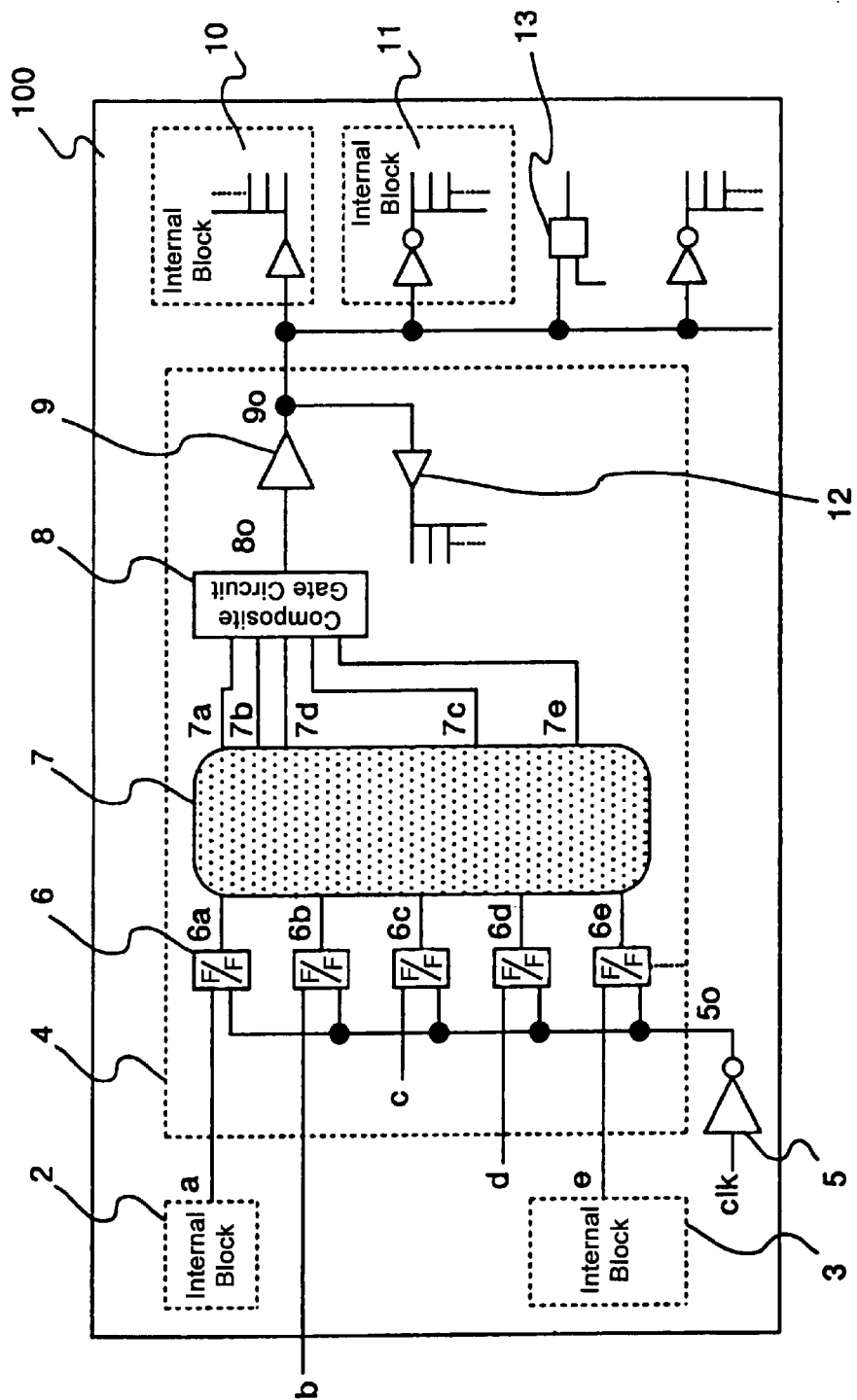
FIG. 18 is a diagram showing an example of a conventional semiconductor integrated device.
Figure 19:
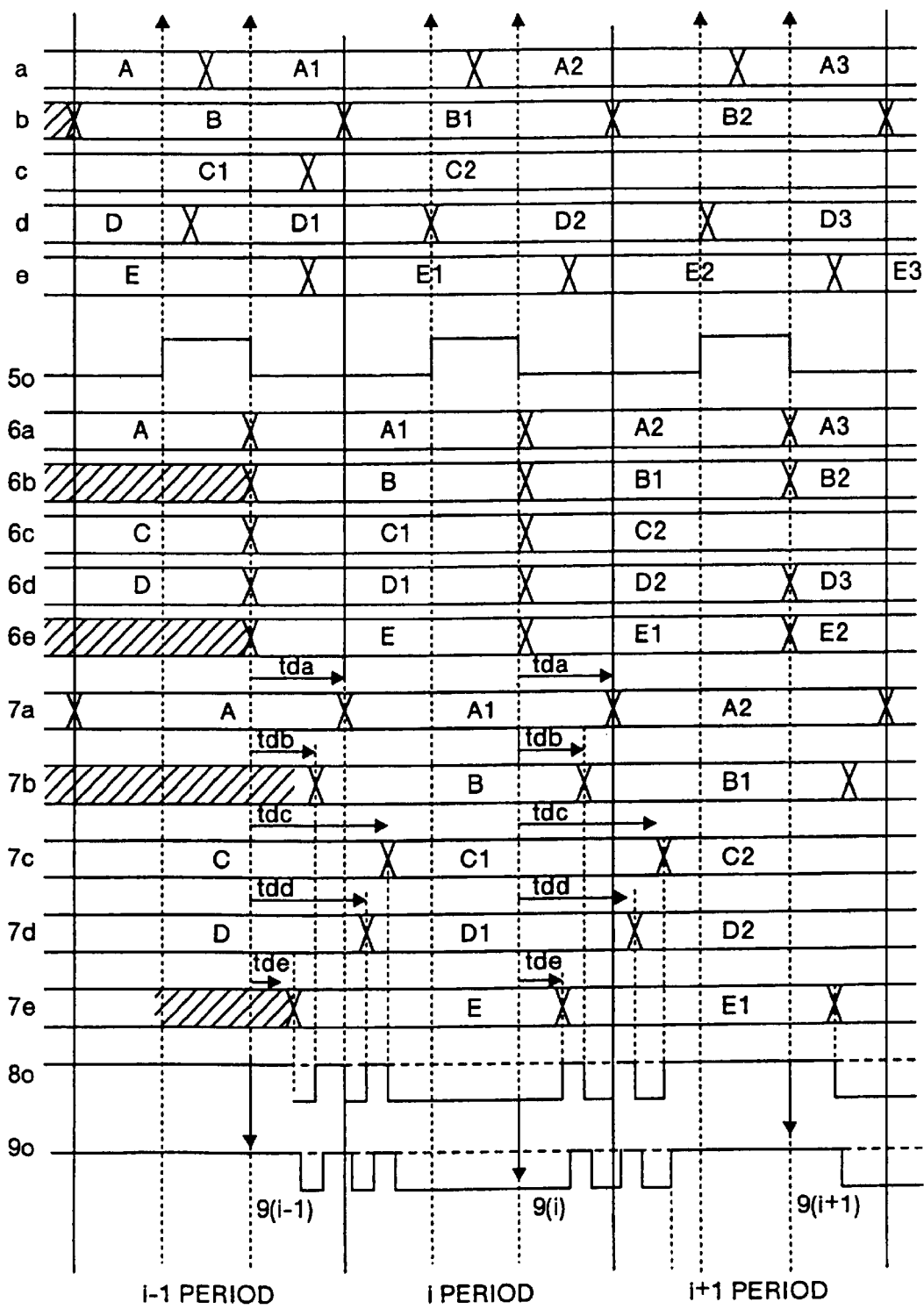
FIG. 19 is a time chart showing operation of a conventional semiconductor integrated device.

FIG. 15 and FIG. 16 are diagrams for explaining the characteristic features of a semiconductor integrated device according to a ninth embodiment. Basic components of the present embodiment are the same as those of the above described first to fifth and eighth embodiments. Therefore, the components of the present embodiment are denoted by like characters, and description thereof will be omitted. In FIG. 15 reference symbols 8A and 8B denote composite gate circuits, and 9A and 9B denote driver circuits. Reference symbols 13A and 13B denote a plurality of inverter circuits connected to the driver circuits 9A and 9B, respectively.

In FIG. 15, a plurality of signals output from the internal block 7 are output to different composite gate circuits. In addition, an output signal of the first composite gate circuit 8A is output from the driver circuit 9A via a control circuit 14 (which may also be 14a or 14b). An output signal of the second composite gate circuit 8B is output from the driver circuit 9B without being passed through a control circuit.

Characteristic features of the IC chip according to the ninth embodiment will now be described in detail with reference to FIG. 15 and FIG. 16. Reference symbols 8a and 8b denote output signals of the composite gate circuits 8A and 8B, respectively. Reference symbols 9a and 9b denote output signals of the driver circuits 9A and 9B, respectively. Reference symbols n(8a) and n(8b) denote the numbers of times of signal changes of the output signals 8a and 8b, respectively.

In the present embodiment, the number of times the signal changes from "H" to "L" or "L" to "H" on each of signal lines in the IC chip is counted. On a signal line having a large number of times of signal changes, a control circuit 14 (which may also be 14a or 14b) is inserted. To be concrete, even if the composite gate circuits 8A and 8B are the same in output wiring length L and FO number as shown in FIG. 15, a control circuit is disposed on the output side of the composite gate circuit 8A, when the number of times of signal changes n(8a) of the output signal 8a of the composite gate circuit 8A is greater than a predetermined number of times N as shown in FIG. 16. On the other hand, a control circuit is not disposed when the number of times of signal changes n(8b) is less than a predetermined number of times N as in the output signal 8b of the composite gate circuit 8B.

The reason why such a configuration is adopted is as follows. That is, a signal line having a large number of times of signal changes is considered to have a high possibility of containing unnecessary signal changes. Irrespective of the disposed wiring and circuit configuration, an insertion location of the control circuit is selected according to the number of times of signal changes of subject signal lines. By the way, the predetermined number of times N serving as the decision criterion is arbitrary, and it may be different from signal line to signal line.

Furthermore, the predetermined number of times N serving as the decision criterion may be determined on the basis of a toggle factor of the signal line. The toggle factor indicates the number of periods over which the subject signal line has changed, in all periods of a certain function pattern. If the subject signal line changes over 20 periods in a function pattern of 100 periods, the toggle factor of the signal line becomes 20%. Therefore, signal changes n (signal) of the subject signal line can be represented by the following equation $$n\ (\text{signal}) = (\text{the number of periods}) \times (\text{toggle factor})$$

As a matter of fact, however, there is a possibility that there are unnecessary signal changes until the signal level becomes definite in the period because of the signal propagation delay difference and soon. Therefore, a signal change during one period is not limited to once. If n (signal)>(the number of periods)×(toggle factor), therefore, it is meant that there are unnecessary signal changes on the signal line.

In the ninth embodiment, therefore, the number N of times of signal changes serving as the decision criterion is determined by the following equation.

$$N = (\text{the number of periods}) \times (\text{toggle factor})$$

or $$N = (\text{the number of periods}) \times (\text{toggle factor}) + \alpha$$

(where $\alpha$ is arbitrary)

By using N thus determined, it is determined whether a control circuit should be inserted. As a result, a control circuit can be effectively inserted on a signal line having unnecessary signal changes.

Thus, in the ninth embodiment, even if different composite gate circuits are the same in output wiring length L and FO number, a control circuit is disposed on the output side of one of the composite gate circuits, when the number of times of signal changes of the composite gate circuit is greater than a predetermined number of times N. On the other hand, a control circuit is not disposed when the number of times of signal changes is less than a predetermined number of times N. As a result, effects similar to those of the first to fourth embodiments described earlier are obtained. In addition, since the disposition location of the control circuit can be selected in more detail than the eighth embodiment, disposition of useless control circuits can be prevented and the chip size can be remarkably reduced.

In the fifth to ninth embodiments, it is also possible to set conditions of disposition locations of a control circuit beforehand, search circuit components and signal operations satisfying the conditions at the time of work on the CAD such as logical synthesis of disposition wiring, automatic disposition wiring, and simulation, and automatically insert a control circuit designed beforehand and described in any of the first to third embodiments when the conditions are satisfied. As a result, the disposition location of the control circuit can be selected in the CAD work stage. Therefore, the time required for insertion location selection can be reduced remarkably. In addition, the disposition forgetting can be prevented. Furthermore, the design time for control circuit insertion can also be shortened.

As heretofore described, according to this invention, there is provided a control circuit having a configuration as follow. That is, when time difference is caused in change timing of a plurality of signals by difference in the paths, the control circuit outputs the received signal as it is during an interval having no possibility of a signal change, i.e., a definite data interval, whereas the control circuit outputs the fixed signal irrespective of the signal level of the received signal during an interval having a possibility of a change of at least one signal, i.e., an indefinite data interval. Owing to such a configuration, propagation of unnecessary signal changes occurring in the conventional technique can be prevented. Therefore, there is brought about an effect that the charge and discharge currents of the whole apparatus can be reduced remarkably. Furthermore, for the same reason, there is brought about an effect that the power dissipation of the whole apparatus can also be reduced remarkably. Furthermore, not only the charge and discharge currents can be reduced, but also operation of transistors caused by unnecessary signal changes is eliminated. In other words, unnecessary switchover operation of a PMOS transistor and an NMOS transistor from "ON" to "OFF" and vice versa is eliminated. As a result, there is brought about an effect that a through current occurring when both transistors are "ON" can also be reduced.

Furthermore, it is determined according to the state of the clock signal serving as the control signal whether the signal input to the control circuit should be output as it is or a fixed signal should be output irrespective of the signal level of the input signal. Propagation of unnecessary signal changes is thus prevented. In addition, therefore, by setting the duty cycle of the clock signal to such a value that an indefinite component of the input signal can be removed, there is brought about an effect that only the signal of the definite interval can be output certainly.

Furthermore, the input signal is latched at a rising edge of the clock and held until the next rising edge. Propagation of unnecessary signal changes is thus prevented. In addition, by causing the rising edge of the clock always in a definite data interval, i.e., in such a position that an indefinite component of the input signal can be removed, there is brought about an effect that only the signal of the definite interval can be output certainly.

Furthermore, the control signal is generated on the basis of a plurality of signals such as the clock signal, signals fed from other internal block circuits, and an external input signal. The control interval can be freely set according to various conditions irrespective of the clock signal. Therefore, there is brought about an effect that the propagation signal can be controlled in a finer manner.

Furthermore, control circuits are disposed in stages preceding comparatively large scale internal clock circuits. Therefore, there is brought about an effect that propagation of unnecessary signal changes can be reduced by taking a block as the unit. Furthermore, since the number of control circuits is kept at a required minimum, there is brought about an effect that increase in scale of the chip size can be prevented.

Furthermore, a control circuit is not disposed on the output side of the composite gate circuit when difference values among delay times of the signals input to the composite gate circuit are small, whereas a control circuit is disposed on the output side of the composite gate circuit when difference values among delay times of the signals input to the composite gate circuit are great. As a result, the disposition location of the control circuit can be selected. Therefore, there is brought about an effect that disposition of useless control circuits can be prevented and the chip size can be remarkably reduced.

Furthermore, when wiring between specific circuits to which the output signal of the composite gate circuit is propagated becomes longer than a predetermined length and there is such disposition wiring that charge and discharge currents and power dissipation become great, a control circuit is disposed on the output side of the composite gate circuit. As a result, the disposition location of the control circuit can be selected. Therefore, there is brought about an effect that disposition of useless control circuits can be prevented and the chip size can be remarkably reduced.

Furthermore, when the output signal of the composite gate circuit is propagated to more circuits than a prescribed number of circuits, or the output of the composite gate circuit is connected to a circuit having a very large drive capability, a control circuit is disposed on the output side of the composite gate circuit, in the present embodiment. As a result, the disposition location of the control circuit can be selected. Therefore, there is brought about an effect that disposition of useless control circuits can be prevented and the chip size can be remarkably reduced.

Furthermore, even if different composite gate circuits are the same in output wiring length L and FO number, a control circuit is disposed on the output side of one of the composite gate circuits, when the number of times of signal changes of the composite gate circuit is greater than a predetermined number of times N. On the other hand, a control circuit is not disposed when the number of times of signal changes is less than a predetermined number of times N. As a result, the disposition location of the control circuit can be selected in more detail. Therefore, there is brought about an effect that disposition of useless control circuits can be prevented more efficiently and the chip size can be remarkably reduced.

Furthermore, it is possible to automatically select the disposition location of the control circuit in the CAD work stage and automatically insert a control circuit. Therefore, there is brought about an effect that the time required for insertion location selection can be reduced remarkably and the disposition forgetting can be prevented. Furthermore, there is brought about an effect that the design time for control circuit insertion can also be shortened.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor integrated circuit device having a CMOS comprising:

a plurality of paths, each path transmitting a data signal;

a composite gate circuit receiving the data signals and outputting a logic signal, the logic signal having a signal level varying due to at least one of differing structures and lengths of paths through which the data signals are transmitted; and a control circuit receiving the logic signal and outputting a fixed signal independent of the signal level of the logic signal received during a time period when the signal level of the logic signal varies, and outputting the logic signal during a time period when the signal level of the logic signal is constant.

2. The semiconductor integrated circuit device according to claim 1, wherein the control circuit comprises a 2-input AND gate receiving an output signal of a preceding stage and a control signal as inputs, and state of the control signal determines whether the control circuit should output the logic signal input to the control circuit, as received, or should output a fixed signal irrespective of signal level of the output signal of the preceding stage.

3. The semiconductor integrated circuit device according to claim 1, wherein the control circuit comprises a D latch circuit supplied with a logic signal at a data terminal and with a control signal at a clock terminal, and the control circuit latches the output signal of the preceding stage at a rising edge of the control signal, and thereafter the control circuit holds an output until receiving another rising edge.

4. The semiconductor integrated circuit device according to claim 1, further comprising a control signal generation circuit which generates a control signal based on a clock signal, a signal supplied from an internal block circuit, and a signal input from outside the semiconductor integrated circuit device.

5. The semiconductor integrated circuit device according to claim 1, wherein the control circuit is disposed in a stage preceding each of internal block circuits having a scale larger than a predetermined scale.

6. The semiconductor integrated circuit device according to claim 1, wherein if a time difference among the plurality of signals input into an internal block circuit is at least equal to a reference value, the control circuit is disposed on an output side of the internal block circuit.

7. The semiconductor integrated circuit device according to claim 1, wherein if wiring between specific circuits to which an output signal of an internal block circuit is propagated is longer than a predetermined length, the control circuit is disposed on an output side of the internal block circuit.

8. The semiconductor integrated circuit device according to claim 1, wherein if an output signal of an internal block circuit is propagated to more circuits than a predetermined number of circuits, the control circuit is disposed on an output side of the internal block circuit.

9. The semiconductor integrated circuit device according to claim 1, wherein if different internal block circuits are the same in wiring length between specific circuits to which output signals of the internal block circuits are propagated and the different internal block circuits are the same in fan-out number, and one of the different internal block circuits has a number of signal changes of an output signal larger than a preset number, then the control circuit is disposed on an output side of the pertinent internal block circuit.

* * * * *